(12) United States Patent
Kitamura et al.

(10) Patent No.: US 7,447,327 B2
(45) Date of Patent: Nov. 4, 2008

(54) FLEXIBLE PCB VOICE COIL CONNECTOR

(75) Inventors: Hajime Kitamura, Shizuoka (JP);
Yoshio Imahori, Shizuoka (JP); Isao Fushimi, Shizuoka (JP)

(73) Assignee: Star Micronics Co., Ltd., Shizuoka (JP)

( * ) Notice: Subject to any disclaimer, the term of this patent is extended or adjusted under 35 U.S.C. 154(b) by 618 days.

(21) Appl. No.: 11/126,202

(22) Filed: May 11, 2005

(65) Prior Publication Data
US 2005/0254680 A1 Nov. 17, 2005

(30) Foreign Application Priority Data
May 11, 2004 (JP) ............................ P2004-141659

(51) Int. Cl.
*H04R 1/00* (2006.01)
(52) U.S. Cl. ........................................ 381/410; 381/409
(58) Field of Classification Search ................. 381/400, 381/401, 407, 409, 410; 439/67; 29/594
See application file for complete search history.

(56) References Cited

U.S. PATENT DOCUMENTS 4,539,442 A * 9/1985 Puls et al. .................... 381/409
5,482,473 A * 1/1996 Lord et al. ..................... 439/67

FOREIGN PATENT DOCUMENTS

| JP | 1-82597 U | 6/1989 |
| JP | 2001-292493 A | 10/2001 |

* cited by examiner

*Primary Examiner*—Brian Ensey
(74) *Attorney, Agent, or Firm*—Sughrue Mion, PLLC

(57) ABSTRACT

In an electroacoustic transducer, a pair of coil terminals elongating from a voice coil are electrically connected to a pair of terminal members attached to a frame via a flexible printed circuit board, respectively. According to the configuration, even in a case where an electroacoustic transducer is used at a high sound pressure, breakage of the coil terminals hardly occurs. In the flexible printed circuit board, the width of an intermediate portion is set to be smaller than the widths of an end portion on the side of the coil terminals and an end portion on the side of the terminal members. Therefore, the flexibility of the intermediate portion can be enhanced, whereby transmission of characteristic vibration of the flexible printed circuit board to a diaphragm, and stress concentration in the vicinity of the end portions are effectively suppressed.

11 Claims, 4 Drawing Sheets

FLEXIBLE PCB VOICE COIL CONNECTOR

BACKGROUND OF THE INVENTION

1. Field of the Invention

The present invention relates to an electroacoustic transducer of a so-called electrodynamic type.

2. Description of the Related Art

Generally, an electroacoustic transducer such as an electrodynamic speaker is configured so that a voice coil is fixed to a lower face of a diaphragm, an outer peripheral edge portion of the diaphragm is supported by a frame, and a pair of coil terminals elongating from the voice coil are electrically connected to a pair of terminal members attached to the frame, respectively.

In a small electroacoustic transducer having such a configuration, as disclosed in, for example, JP-A-2001-292493, the coil terminals are often led as they are to be located on the frame, and then electrically conductively fixed directly to the terminal members.

By contrast, JP-UM-A-1-82597 discloses an electroacoustic transducer in which terminal members and coil terminals are electrically connected to each other via a flexible printed circuit board.

SUMMARY OF THE INVENTION

In the case where the coil terminals are electrically conductively fixed directly to the terminal members as in the electroacoustic transducer disclosed in JP-A-2001-292493, the coil terminals vibrate in accordance with vibration of the diaphragm. When the transducer is used at a high sound pressure, therefore, there arises a problem in that stress concentration occurs in a part of the coil terminals and the coil terminals are likely to be broken.

By contrast, when, as in the electroacoustic transducer disclosed in JP-UM-A-1-82597, electrical connections between the terminal members and the coil terminals are conducted via the flexible printed circuit board, it is possible to prevent the coil terminals from being broken.

In this configuration, however, the flexible printed circuit board which is significantly heavier than the coil terminals vibrates in accordance with vibration of the diaphragm. Consequently, there is a problem in that characteristic vibration of the flexible printed circuit board is transmitted to the diaphragm and abnormal vibration is likely to occur in the diaphragm.

When the width of the flexible printed circuit board is reduced, the energy of such characteristic vibration can be reduced, so that occurrence of abnormal vibration in the diaphragm can be suppressed. In this case, however, there is another problem in that stress concentration occurs in the vicinity of the both ends of the flexible printed circuit board, and conductor breakage is likely to occur in the flexible printed circuit board.

The invention has been made in view of such circumstances. It is an object of the invention to provide an electroacoustic transducer, which is an electroacoustic transducer of the electrodynamic type, and in which breakage of coil terminals and the like, and occurrence of abnormal vibration in a diaphragm can be suppressed.

In the present invention, electrical connections between coil terminals and terminal members are conducted via a flexible printed circuit board, and the configuration of the flexible printed circuit board is improved, thereby attaining the object.

An electroacoustic transducer according to an aspect of the invention includes: a diaphragm; a voice coil which is fixed to a lower face of the diaphragm and has a pair of coil terminals elongating therefrom; a frame which supports an outer peripheral edge portion of the diaphragm; a pair of terminal members which are attached to the frame; and a conductive member which electrically connects the pair of terminal members to the pair of coil terminals, respectively, wherein the conductive member is configured by a flexible printed circuit board in which a pair of conductive patterns are formed on an insulating film, the conductive member is electrically conductively fixed to the coil terminals and the terminal members in respective end portions of the conductive patterns, and in the flexible printed circuit board, a width of an intermediate portion which is located between an end portion on a side of the coil terminals and an end portion on a side of the terminal members is set to be smaller than widths of the end portions.

The kind of "electroacoustic transducer" is not particularly limited. For example, a speaker, a receiver, and the like may be employed as the transducer.

The specific configuration for electrically conductively fixing the end portions of the conductive patterns to the coil terminals and the terminal members is not particularly limited. For example, soldering, thermocompression bonding, and the like may be employed as the configuration.

The specific value of the width of the flexible printed circuit board, and the ratio of the widths of the end portions to that of the intermediate portion are not particularly limited as far as the width of the intermediate portion is set to be smaller than the widths of the end portions.

As described above, the electroacoustic transducer of the invention is configured so that the pair of coil terminals elongating from the voice coil are electrically connected to the pair of terminal members attached to the frame via the conductive member, respectively. The conductive member is configured by the flexible printed circuit board in which the pair of conductive patterns are formed on the insulating film, and electrically conductively fixed to the coil terminals and the terminal members, in respective end portions of the conductive patterns. Even in cases such as that where the electroacoustic transducer is used at a high sound pressure, therefore, the coil terminals can be effectively prevented from being broken.

In this configuration, in the flexible printed circuit board, the width of the intermediate portion is set to be smaller than the widths of the end portion on the side of the coil terminals and the end portion on the side of the terminal members. Therefore, it is possible to attain the following effects.

Since the width of the intermediate portion of the flexible printed circuit board is set to be a relatively smaller value, the flexibility of the intermediate portion can be enhanced, and the mass of the intermediate portion can be reduced. According to the configuration, the energy of characteristic vibration of the flexible printed circuit board can be reduced. Therefore, a phenomenon that characteristic vibration of the flexible printed circuit board is transmitted to the diaphragm and abnormal vibration occurs in the diaphragm can be effectively suppressed.

If the flexible printed circuit board is configured so as to have a constant width, when the flexible printed circuit board vibrates, stress concentration easily occurs in the vicinity of an end portion of the circuit board on the side of the coil terminals or the vicinity of an end portion on the side of the terminal members. However, the widths of the both end portions are set to be relatively larger values, and hence the strength of the portions where stress is concentrated can be enhanced. As a result, it is possible to effectively prevent conductor breakage from occurring in the flexible printed circuit board.

As described above, according to the invention, breakage of the coil terminals and the like, and occurrence of abnormal vibration in the diaphragm can be suppressed in the electroacoustic transducer of the electrodynamic type. Therefore, the life of the electroacoustic transducer can be prolonged, and, even when the transducer is used at a high sound pressure, a sound quality in which the distortion level is low can be obtained.

In the above configuration, also with respect to widths of the conductive patterns, a width in the intermediate portion may be set to be smaller than widths in the end portions. In this configuration, the width of the intermediate portion of the flexible printed circuit board can be set to be a value which is sufficiently smaller than the widths of the end portions. Therefore, the above-described effects can be further enhanced.

In the above configuration, in the flexible printed circuit board, widths of portions where the intermediate portion is connected to the end portions may be gradually increased as advancing from the intermediate portion to the end portions. According to the configuration, the stress distributions in the connecting portions can be uniformed. Therefore, it is possible to more effectively prevent stress concentration from occurring in the flexible printed circuit board.

In the above configuration, when the width of the intermediate portion of the flexible printed circuit board is set to be equal to or smaller than 2 mm, the flexibility of the intermediate portion can be well enhanced, and the mass of the intermediate portion can be sufficiently reduced. According to the configuration, the energy of characteristic vibration of the flexible printed circuit board can be sufficiently reduced. In this case, more preferably, the width of the intermediate portion is set to be equal to or smaller than 1.5 mm, and further preferably equal to or smaller than 1 mm.

In the above configuration, the specific value of the thickness of the flexible printed circuit board is not particularly limited. When the thickness is set to be a value which is equal to or smaller than 0.25 mm, the flexibility of the intermediate portion can be well enhanced, and the mass of the intermediate portion can be sufficiently reduced. According to the configuration, the energy of characteristic vibration of the flexible printed circuit board can be sufficiently reduced. In this case, more preferably, the thickness of the intermediate portion is set to be equal to or smaller than 0.15 mm, and further preferably equal to or smaller than 0.1 mm.

In the above configuration, when electrical conduction and fixation between the conductive patterns and the coil terminals are conducted by thermocompression bonding, the workability of the electrical conduction and fixation can be enhanced as compared with the case where the electrical conduction and fixation are conducted by soldering or the like. When the electrical conduction and fixation on the movable side are conducted by thermocompression bonding as described above, performance degradation caused by, for example, deformation of the flexible printed circuit board due to heat generated in soldering, and characteristic reduction of the electroacoustic transducer due to variation of the amount of supplied solder can be prevented from occurring.

In the above configuration, when the end portion of the flexible printed circuit board on the side of the coil terminals is clampingly held by the voice coil and the diaphragm, a large load can be prevented from being accidentally applied to portions of the coil terminals which are electrically conductively fixed to the conductive patterns. According to the configuration, it is possible to more effectively prevent conductor breakage from occurring in the coil terminals and the like.

In the above configuration, the upper end portion of the voice coil may be supported by a predetermined coil supporting member, and an engagement structure for engagingly holding the end portion of the flexible printed circuit board on the side of the coil terminals may be disposed on the coil supporting member. In this configuration, electrical conduction and fixation between the conductive patterns and the coil terminals can be conducted in a state where the flexible printed circuit board is positioned. As a result, the workability of the electrical conduction and fixation can be further enhanced.

In this case, although the specific configuration of "coil supporting member" is not particularly limited, the following configuration may be employed. The coil supporting member is configured as an annular member, and a plurality of caulking protrusions are formed at predetermined circumferential intervals on the upper face of the coil supporting member. A plurality of through holes through which the caulking protrusions are to be passed are formed in the diaphragm. At least one through hole through which at least one of the caulking protrusions is to be passed is formed in the end portion of the flexible printed circuit board on the side of the coil terminals. In a state where the at least one caulking protrusion of the coil supporting member is passed through the at least one through hole of the flexible printed circuit board and the caulking protrusions of the coil supporting member are passed through the through holes of the diaphragm, these caulking protrusions are plastically deformed to caulk the coil supporting member to the diaphragm. According to the configuration, the engagement structure can be used not only for positioning in the electrical conduction and fixation between the conductive patterns and the coil terminals, but also as a support structure for the flexible printed circuit board after the electroacoustic transducer is completed.

DETAILED DESCRIPTION OF THE PREFFERED EMBODIMENTS

Hereinafter, an embodiment of the invention will be described with reference to the accompanying drawings.

Figure 1:
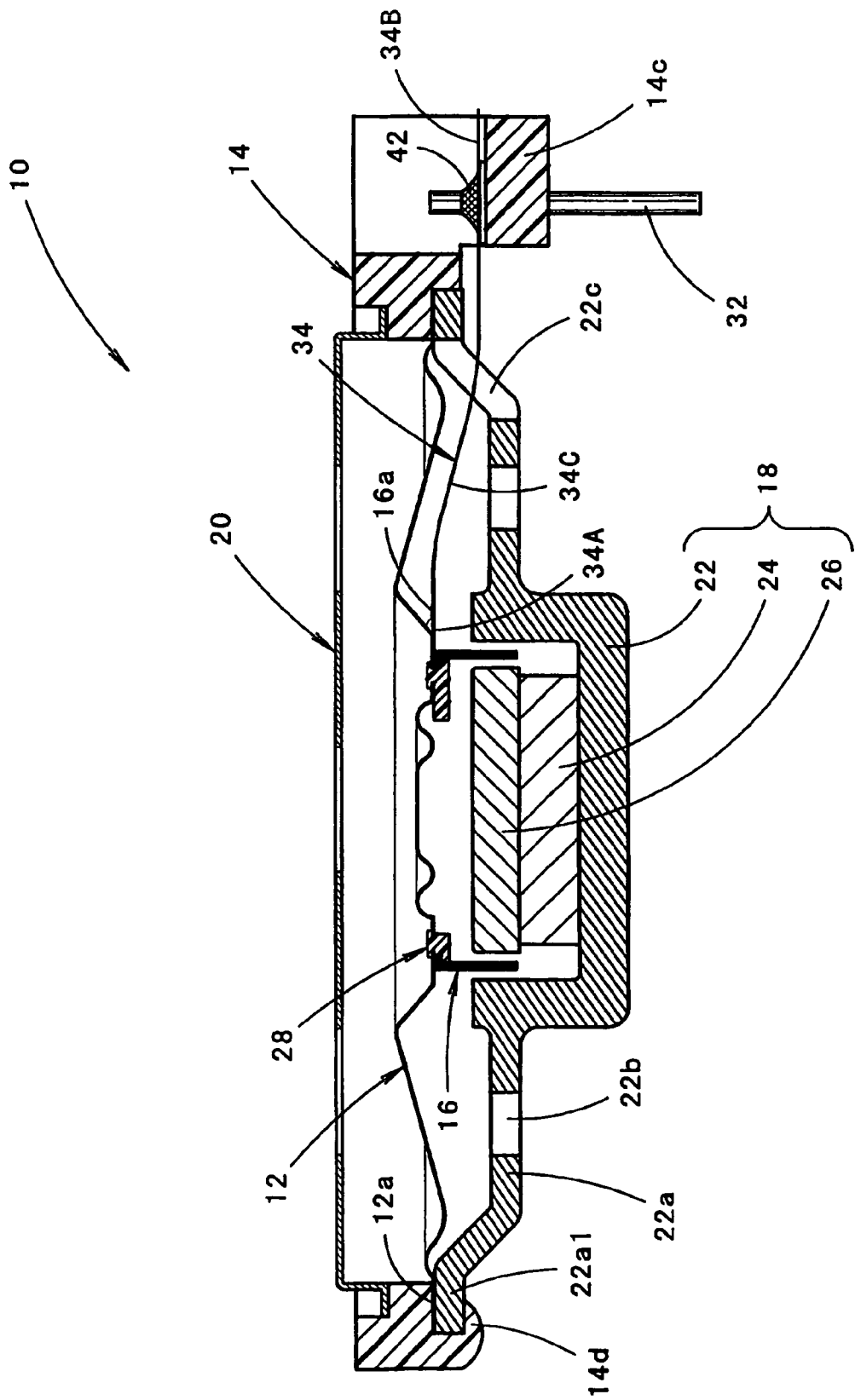
FIG. 1 is a side sectional view of an electroacoustic transducer according to an embodiment of the invention in a state where the transducer is upward directed.
Figure 2:
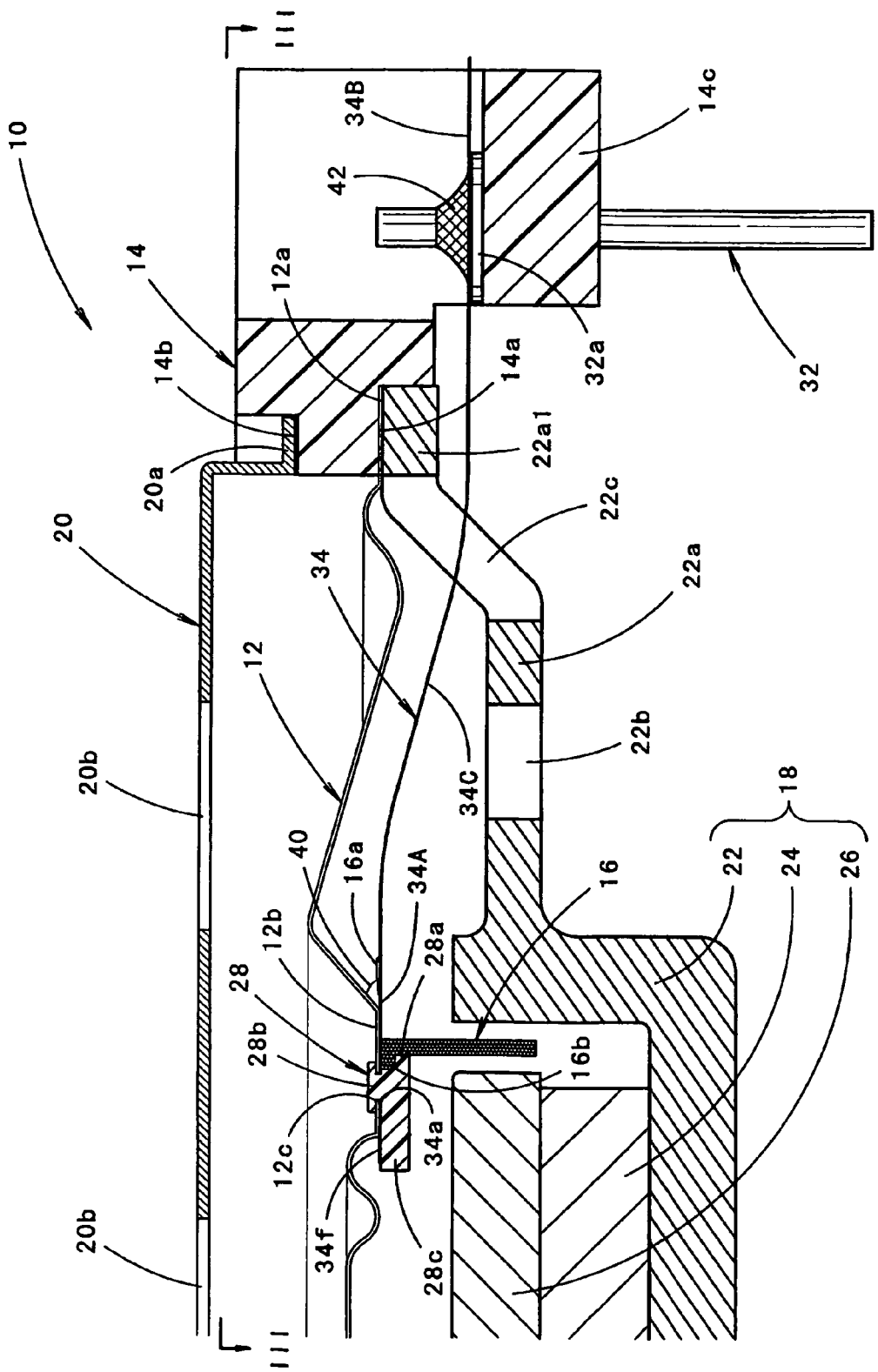
FIG. 2 is a detailed view of main portions of FIG. 1.
Figure 3:
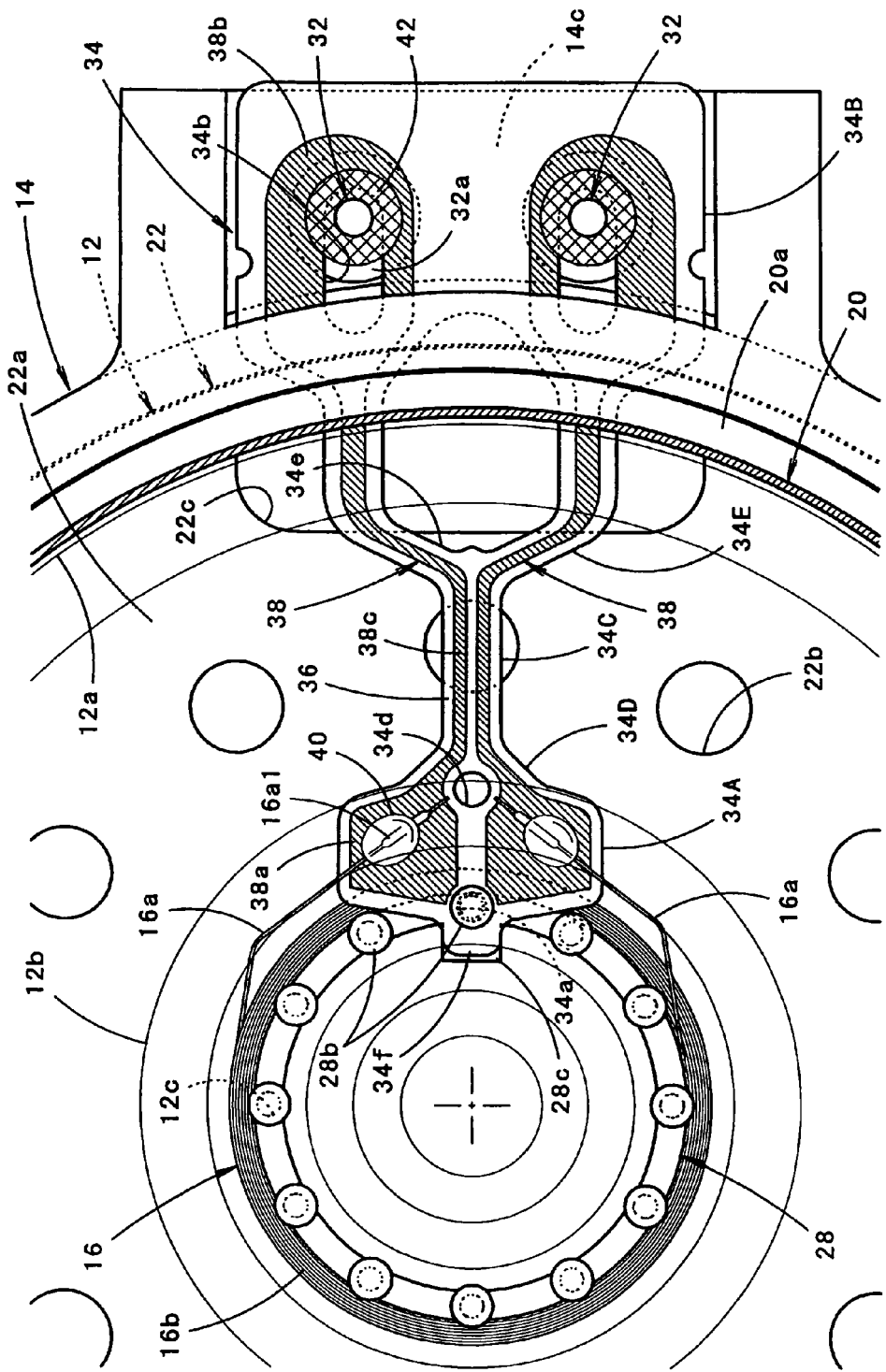
FIG. 3 is a view looking in the direction of the line III-III in FIG. 2.

FIG. 1 is a side sectional view of an electroacoustic transducer 10 of an embodiment of the invention in a state where the transducer is upward directed, FIG. 2 is a detailed view of main portions of FIG. 1, and FIG. 3 is a view looking in the direction of the line III-III in FIG. 2.

As shown in the figures, the electroacoustic transducer 10 is a small speaker of the electrodynamic type having an outer diameter of about 10 to 40 mm (for example, about 30 mm), and includes: a diaphragm 12; a frame 14 which supports the diaphragm 12; a voice coil 16 in which an upper end portion is fixed to the lower face of the diaphragm 12; a magnetic circuit unit 18 in which a cylindrical magnetic gap for housing a lower end portion of the voice coil 16 is formed; a cover 20 which covers the diaphragm 12 from the upper side; a pair of terminal members 32 which are attached to the frame 14; and a flexible printed circuit board 34 serving as a conductive member which electrically connects the pair of terminal members 32 to a pair of coil terminals 16a elongating from the voice coil 16, respectively.

The diaphragm 12 is a circular film-like member which is made of a synthetic resin, and in which plural concave and convex shapes are concentrically formed. In the diaphragm, an outer peripheral edge portion 12a and an intermediate annular portion 12b are formed as annular planes.

The frame 14 is an annular member made of a synthetic resin. A diaphragm supporting portion 14a which supports the outer peripheral edge portion 12a of the diaphragm 12 is formed in an inner peripheral portion of the lower face of the frame, and a cover supporting portion 14b is formed in an inner peripheral portion of the upper face. A terminal member supporting portion 14c for fixedly supporting the terminal members 32 is formed at one place of the circumference of the frame 14, so as to be protruded radially outward in a shelf-like manner from the frame 14.

Each of the terminal members 32 is configured by a flanged metal pin which vertically passes through the terminal member supporting portion 14c. The terminal members 32 are arranged with forming a predetermined gap therebetween so that their flanges 32a are exposed from the upper face of the terminal member supporting portion 14c of the frame 14.

Fixation of the voice coil 16 to the diaphragm 12 is conducted in the following manner via a coil supporting member 28 which is configured as an annular member made of a synthetic resin.

Namely, a flange 16b which protrudes radially inward is formed in the upper end portion of the voice coil 16. By contrast, an engaging portion 28a which protrudes radially outward is formed in a lower portion of the coil supporting member 28. The engaging portion 28a is engaged with the flange 16b of the voice coil 16.

A plurality of columnar caulking protrusions 28b are formed at predetermined circumferential intervals on the upper face of the coil supporting member 28. In the intermediate annular portion 12b of the diaphragm 12, a plurality of through holes 12c through which the caulking protrusions 28b are to be passed are formed. In a state where the caulking protrusions 28b are passed through the through holes 12c, the caulking protrusions are plastically deformed to caulk the coil supporting member 28 to the diaphragm 12.

During this fixation, an end portion 34A of the flexible printed circuit board 34 on the side of the coil terminals is clampingly held by the voice coil 16 and the coil supporting member 28, and the diaphragm 12. This will be described later.

In an upper portion of the coil supporting member 28, a positioning protrusion 28c which is substantially rectangular, and which protrudes radially inward is formed at a position where one of the caulking protrusions 28b is formed. The positioning protrusion 28c is used for circumferential positioning during a process of winding the voice coil 16. The pair of coil terminals 16a elongate from the voice coil 16 on the lateral sides of the positioning protrusion 28c, respectively.

The magnetic circuit unit 18 is configured by: a base 22 which is made of steel, and which is formed into a substantially tray-like shape; a magnet 24 which is formed into a relatively thick disk-like shape; and a yoke 26 which is made of steel, and which is formed into a relatively thin disk-like shape. The lower end portion of the voice coil 16 is housed in an annular space between the inner peripheral face of the base 22 and the outer peripheral face of the yoke 26.

An annular flange 22a is elongatedly formed in an outer peripheral portion of the base 22. An outer peripheral edge portion 22a1 of the annular flange 22a is formed into an upward step-like shape, and caulk-fixed to the frame 14. The caulk fixation is conducted by, in a state where the outer peripheral edge portion 12a of the diaphragm 12 is clamped from the upper and lower sides by the outer peripheral edge portion 22a1 of the base 22 and the diaphragm supporting portion 14a of the frame 14, plastically deforming caulking protrusions 14d formed in plural circumferential places of an outer peripheral portion of the lower face of the frame 14, to cause the caulking protrusions to be engaged with the lower face of the outer peripheral edge portion 22a1 of the base 22.

In the annular flange 22a of the base 22, a sound release hole 22b is formed in plural circumferential places, and a passage hole 22c through which the flexible printed circuit board 34 is to be passed is formed in one circumferential place.

The cover 20 is configured by a steel plate which is formed into a substantially inverted tray-like shape, and fixed in an outer peripheral edge portion 20a to the cover supporting portion 14b of the frame 14. In the cover 20 also, a sound release hole 20b is formed in plural places.

Figure 4:
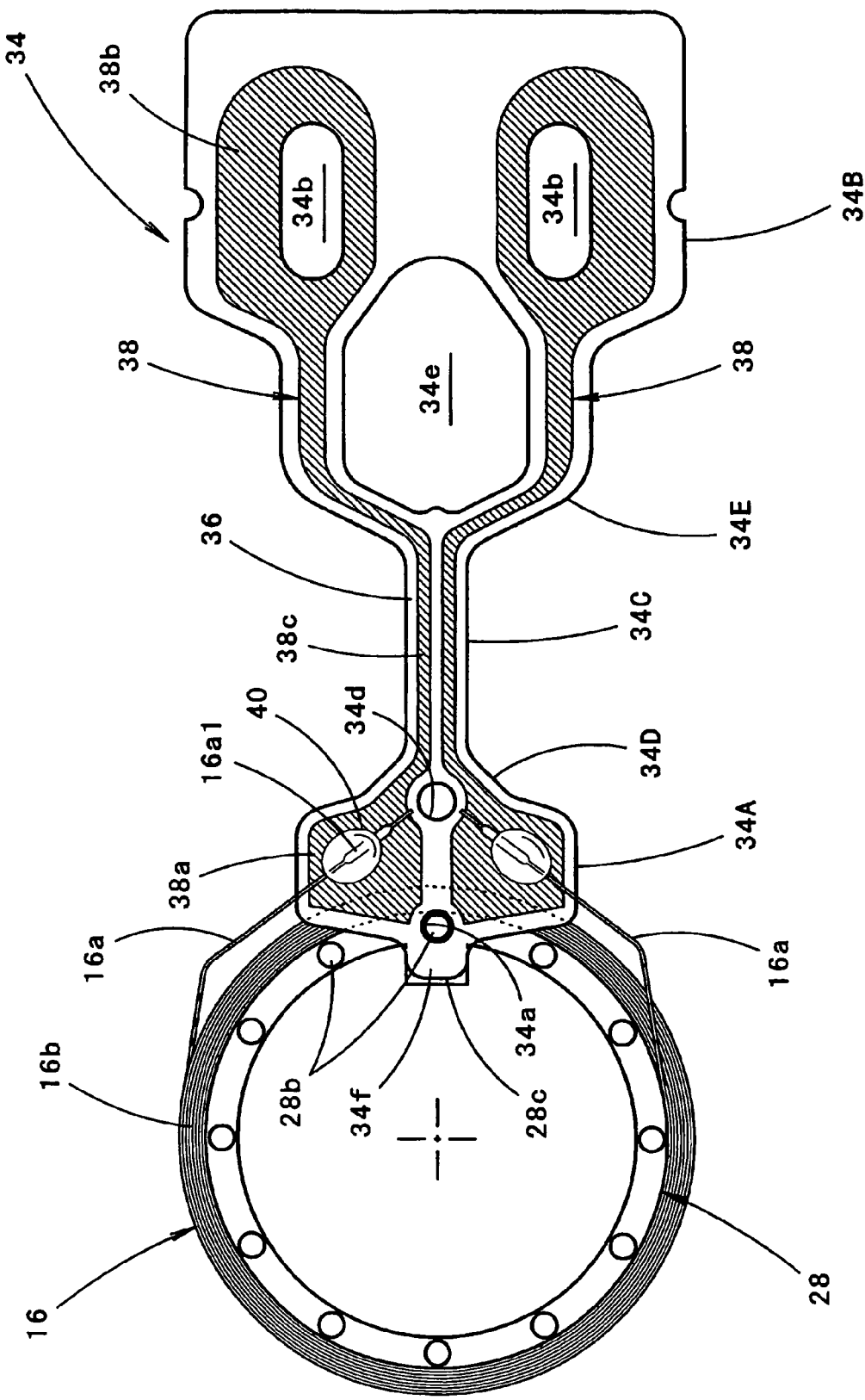
FIG. 4 is a plan view showing a flexible printed circuit board of the electroacoustic transducer in a state where coil terminals of a voice coil are electrically conductively fixed to the flexible printed circuit board.

FIG. 4 is a plan view showing the flexible printed circuit board 34 in a state where the coil terminals 16a of the voice coil 16 are electrically conductively fixed to the flexible printed circuit board 34.

As shown in the figure, in the flexible printed circuit board 34, a pair of conductive patterns 38 are formed on an insulating film 36, and the coil terminals 16a and the terminal members 32 are to be electrically conductively fixed to both end portions of the conductive patterns 38.

The insulating film 36 is formed into a shape which is laterally symmetrical about the longitudinal direction of the flexible printed circuit board 34, and also the pair of conductive patterns 38 are formed into a laterally symmetrical shape.

The insulating film 36 is configured by a film made of a synthetic resin such as polyimide, and the conductive patterns 38 are configured by a metal foil such as a rolled copper foil. On the flexible printed circuit board 34, a coverlay having an insulating film-like shape is formed in a range where the electrical conduction and fixation between the conductive patterns 38, and the coil terminals 16a and the terminal members 32 are not impeded.

In the flexible printed circuit board 34, the thickness is set to a value which is equal to or smaller than 0.25 mm (for example, about 0.1 mm).

In the flexible printed circuit board 34, the width of an intermediate portion 34C positioned between an end portion 34A on the side of the coil terminals and an end portion 34B on the side of the terminal members is set to be smaller than the widths of the end portions. Specifically, the width of the intermediate portion 34C of the flexible printed circuit board 34 is set to be a value which is equal to or smaller than 2 mm (for example, about 1 mm). The widths of the end portions 34A and 34B are set to be a value which is equal to or larger than 3 mm (for example, the width of the coil terminal-side end portion 34A is about 4.5 mm and the terminal member-side end portion 34B is about 8 mm).

In this case, a connecting portion 34D where the coil terminal-side end portion 34A is connected to the intermediate portion 34C is formed so that its width is gradually increased as advancing from the intermediate portion 34C to the coil terminal-side end portion 34A. A relatively small through hole 34d is formed in the connecting portion 34D, so that the connecting portion 34D is branched to two branch portions. The total width of the two branch portions is larger than the width of the intermediate portion 34C.

A connecting portion 34E where the terminal member-side end portion 34B is connected to the intermediate portion 34C is formed so that its width is gradually increased as advancing from the intermediate portion 34C to the terminal member-side end portion 34B. A relatively large through hole 34e is formed in the connecting portion 34E, so that the connecting portion 34E is branched to two branch portions. The total width of the two branch portions is larger than the width of the intermediate portion 34C.

In the coil terminal-side end portion 34A of the flexible printed circuit board 34, a tab 34f is formed in a tip end portion, and a circular through hole 34a is formed in a basal end portion of the tab 34f. The through hole 34a has a diameter which is slightly larger than that of the caulking protrusion 28b of the coil supporting member 28. In the terminal member-side end portion 34B of the flexible printed circuit board 34, a pair of right and left oblong through holes 34b are formed. The through holes 34b are slightly larger in width than the terminal members 32, and elongate in the longitudinal direction of the flexible printed circuit board 34.

The conductive patterns 38 are formed so as to elongate substantially along the shape of the flexible printed circuit board 34. In each of the conductive patterns 38, the width of an intermediate portion 38c is set to be smaller than the widths of end portions 38a, 38b which are positioned respectively in the end portions 34A, 34B of the flexible printed circuit board 34. Specifically, the width of the each of the conductive patterns 38 in the intermediate portion 38c is set to be a value which is equal to or smaller than 0.4 mm (for example, about 0.2 mm). In the conductive patterns 38, the coil terminal-side end portions 38a are formed as approximately trapezoidal land portions which are respectively on right and left sides between the through holes 34a, 34d, and the terminal member-side end portions 38b are formed as approximately oblong land portions which surround the through holes 34b, respectively.

The electrical conduction and fixation between the conductive patterns 38 and the coil terminals 16a are conducted by thermocompression bonding in the coil terminal-side end portions 38a. The thermocompression bonding is conducted in a state where the through hole 34a of the flexible printed circuit board 34 is engaged with the caulking protrusion 28b which is located in the vicinity of the positioning protrusion 28c in the coil supporting member 28, so that the flexible printed circuit board 34 is positioned with respect to the coil supporting member 28. In each of the coil terminals 16a, an overcoat 40 is applied by spot bonding or the like to an electrical conduction and fixation portion 16a1 which is formed by the thermocompression bonding.

By contrast, the electrical conduction and fixation between the conductive patterns 38 and the terminal members 32 are conducted by soldering. The soldering is conducted by applying solder 42 to the peripheries of the terminal members 32 in a state where the through holes 34b of the flexible printed circuit board 34 are engaged with the upper end portions of the terminal members 32, and the terminal member-side end portions 34B overlap with the upper faces of the flanges 32a of the terminal members 32, respectively.

Next, effects of the embodiment will be described.

The electroacoustic transducer 10 of the embodiment includes the flexible printed circuit board 34 in which the pair of conductive patterns 38 are formed on the insulating film 36, and the end portions 38a, 38b of the conductive patterns 38 are electrically conductively fixed to the coil terminals 16a elongating from the voice coil 16, and the terminal members 32 attached to the frame 14. Even in cases such as that where the electroacoustic transducer 10 is used at a high sound pressure, therefore, the coil terminals 16a can be effectively prevented from being broken.

In the flexible printed circuit board 34, the width of the intermediate portion 34C is set to be smaller than the widths of the coil terminal-side end portion 34A and the terminal member-side end portion 34B. Therefore, the following effects can be attained.

Since the width of the intermediate portion 34C of the flexible printed circuit board 34 is set to a relatively smaller value, the flexibility of the intermediate portion 34C can be enhanced, and the mass of the intermediate portion can be reduced. According to the configuration, the energy of characteristic vibration of the flexible printed circuit board 34 can be reduced. Therefore, a phenomenon that characteristic vibration of the flexible printed circuit board 34 is transmitted to the diaphragm 12 and abnormal vibration occurs in the diaphragm 12 can be effectively suppressed.

If the flexible printed circuit board 34 is configured so as to have a constant width, when the flexible printed circuit board 34 vibrates, stress concentration easily occurs in the vicinity of the coil terminal-side end portion 34A or the vicinity of the terminal member-side end portion 34B. However, the widths of the both end portions 34A, 34B are set to relatively larger values, and hence the strength of the portions where stress is concentrated can be enhanced. As a result, it is possible to effectively prevent conductor breakage from occurring in the flexible printed circuit board 34.

In the flexible printed circuit board 34, the thickness of the flexible printed circuit board is set to a value which is equal to or smaller than 0.25 mm, and the width of the intermediate portion 34C is set to a value which is equal to or smaller than 2 mm. Therefore, the flexibility of the intermediate portion 34C can be well enhanced, and the mass of the intermediate portion can be sufficiently reduced. According to the configuration, the energy of characteristic vibration of the flexible printed circuit board 34 can be sufficiently reduced.

In the embodiment, as described above, conductor breakage can be prevented from occurring in the coil terminals 16a and the flexible printed circuit board 34, and abnormal vibration can be prevented from occurring in the diaphragm 12. Therefore, the life of the electroacoustic transducer 10 can be prolonged, and, even when the transducer is used at a high sound pressure, a sound quality in which the distortion level is low can be obtained.

In the embodiment, also with respect to the widths of the conductive patterns 38, the width of the intermediate portion 38c is set to be smaller than the widths of the end portions 38a, 38b. In this configuration, the width of the intermediate portion 34C of the flexible printed circuit board 34 can be set to a value which is sufficiently smaller than the widths of the end portions 34A, 34B. Therefore, the above-described effects can be further enhanced.

In the embodiment, in the flexible printed circuit board 34, the widths of the connecting portions 34D, 34E where the intermediate portion 34C is connected to the end portions 34A, 34B are set so as to be gradually increased as advancing from the intermediate portion 34C to the end portions 34A, 34B. According to the configuration, the stress distributions in the connecting portions 34D, 34E can be uniformed. Therefore, it is possible to more effectively prevent stress concentration from occurring in the flexible printed circuit board 34.

In the embodiment, electrical conduction and fixation between the conductive patterns 38 and the coil terminals 16a are conducted by thermocompression bonding. Therefore, the workability of the electrical conduction and fixation can be enhanced as compared with the case where the electrical conduction and fixation are conducted by soldering or the like. When the electrical conduction and fixation on the movable side are conducted by thermocompression bonding as described above, performance degradation caused by, for example, deformation of the flexible printed circuit board 34 due to heat generated in soldering, and characteristic reduction of the electroacoustic transducer 10 due to variation of the amount of supplied solder can be prevented from occurring.

In the embodiment, since the coil terminal-side end portion 34A of the flexible printed circuit board 34 is clampingly held by the voice coil 16 and the diaphragm 12, a large load can be prevented from being accidentally applied to the electrical conduction and fixation portions 16a1 of the coil terminals 16a which are electrically conductively fixed to the conductive patterns 38. According to the configuration, it is possible to more effectively prevent conductor breakage from occurring in the coil terminals 16a and the like. In the embodiment, moreover, the overcoat 40 is applied to the electrical conduction and fixation portions 16a1, and hence conductor breakage can be more effectively prevented from occurring in the coil terminals 16a and the like.

In the embodiment, the upper end portion of the voice coil 16 is supported by the coil supporting member 28, and the engagement structure for engaging the coil terminal-side end portion 34A of the flexible printed circuit board 34 is disposed on the coil supporting member 28. Therefore, electrical conduction and fixation between the conductive patterns 38 and the coil terminals 16a can be conducted in a state where the flexible printed circuit board 34 is positioned. As a result, the workability of the electrical conduction and fixation can be further enhanced.

In this case, the coil supporting member 28 is configured as an annular member, and the caulking protrusions 28b are formed at predetermined circumferential intervals on the upper face of the coil supporting member. The plurality of through holes 12c are formed in the diaphragm 12. The through hole 34a is formed in the coil terminal-side end portion 34A of the flexible printed circuit board 34. In the state where one of the caulking protrusions 28b is passed through the through hole 34a of the flexible printed circuit board 34, and the caulking protrusions 28b are passed through the through holes 12c of the diaphragm 12, the caulking protrusions 28b are plastically deformed to rivet the coil supporting member 28 to the diaphragm 12. Therefore, the engagement structure can be used not only for positioning in the electrical conduction and fixation between the conductive patterns 38 and the coil terminals 16a, but also as a support structure for the flexible printed circuit board 34 after the electroacoustic transducer 10 is completed.

In the embodiment described above, each of the connecting portions 34D, 34E where the intermediate portion 34C of the flexible printed circuit board 34 is connected to the end portions 34A, 34B is branched to two branch portions. It is a matter of course that the connecting portions may not be branched to two branch portions. In the alternative also, the same effects as the embodiment can be attained.

In the embodiment described above, the electroacoustic transducer 10 is a small speaker having an outer diameter of about 10 to 40 mm. Also in the case where the speaker has a size different from these values, or the electroacoustic transducer is a transducer other than a speaker, such as a receiver, when a configuration similar to that of the embodiment is employed, it is possible to attain similar effects as those of the embodiment.

What is claimed is:

1. An electroacoustic transducer comprising:
    a diaphragm;
    a voice coil which is fixed to a lower face of the diaphragm and has a pair of coil terminals elongating therefrom;
    a frame which supports an outer peripheral edge portion of the diaphragm; a pair of terminal members which are attached to the frame; and
    a conductive member which electrically connects the pair of terminal members to the pair of coil terminals, respectively,
    wherein the conductive member is configured by a flexible printed circuit board in which a pair of conductive patterns are formed on an insulating film, the conductive member is electrically conductively fixed to the coil terminals and the terminal members in respective end portions of the conductive patterns, and
    in the flexible printed circuit board, a width of an intermediate portion which is located between an end portion on a side of the coil terminals and an end portion on a side of the terminal members is set to be smaller than widths of the end portions;
    wherein electrical conduction and fixation between the conductive patterns and the coil terminals are conducted by thermocompression bonding, and
    wherein the thermocompression bonding is preformed by applying heat and pressure to the conductive patterns and the coil terminals, to thereby be self-welded with each other without any solder.

2. The electroacoustic transducer according to claim 1, wherein in each of the conductive patterns, a width in the intermediate portion is smaller than widths in the end portions.

3. The electroacoustic transducer according to claim 1, wherein in the flexible printed circuit board, widths of portions where the intermediate portion is connected to the end portions are gradually increased as advancing from the intermediate portion to the end portions.

4. The electroacoustic transducer according to claim 1, wherein a width of the intermediate portion of the flexible printed circuit board is set to be equal to or smaller than 2 mm.

5. The electroacoustic transducer according to claim 1, wherein a thickness of the flexible printed circuit board is set to be equal to or smaller than 0.25 mm.

6. The electroacoustic transducer according to claim 1, wherein in the flexible printed circuit board, the end portion on the side of the coil terminals is clampingly held by the voice coil and the diaphragm.

7. The electroacoustic transducer according to claim 2, wherein in the flexible printed circuit board, widths of portions where the intermediate portion is connected to the end portions are gradually increased as advancing from the intermediate portion to the end portions.

8. The electroacoustic transducer according to claim 7, wherein a width of the intermediate portion of the flexible printed circuit board is set to be equal to or smaller than 2 mm.

9. The electroacoustic transducer according to claim 8, wherein a thickness of the flexible printed circuit board is set to be equal to or smaller than 0.25 mm.

10. The electroacoustic transducer according to claim 1, wherein in the flexible printed circuit board, the end portion on the side of the coil terminals is clampingly held by the voice coil and the diaphragm.

11. The electroacoustic transducer according to claim 1, wherein a part, where the electrical conduction and fixation is conducted between the conductive patterns and the coil terminals, is applied with an overcoat by spot bonding, the overcoat preventing breaking of the coil terminals.

* * * * *